US009659755B2

(12) United States Patent
Sato

(10) Patent No.: US 9,659,755 B2
(45) Date of Patent: May 23, 2017

(54) PLASMA GENERATOR AND THERMAL ELECTRON EMITTER

(71) Applicant: Sumitomo Heavy Industries Ion Technology Co., Ltd., Tokyo (JP)

(72) Inventor: Masateru Sato, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/155,504

(22) Filed: May 16, 2016

(65) Prior Publication Data

US 2016/0351379 A1  Dec. 1, 2016

(30) Foreign Application Priority Data

May 29, 2015 (JP) ................................. 2015-110349

(51) Int. Cl.
*H01J 27/08* (2006.01)
*H01J 37/32* (2006.01)

(52) U.S. Cl.
CPC .... *H01J 37/32669* (2013.01); *H01J 37/3244* (2013.01); *H01J 37/3255* (2013.01); *H01J 37/32055* (2013.01); *H01J 37/32458* (2013.01); *H01J 37/32541* (2013.01); *H01J 2237/3365* (2013.01)

(58) Field of Classification Search
CPC ............ H01J 37/32669; H01J 37/3244; H01J 37/32458; H01J 37/32055; H01J 37/32541; H01J 37/3255; H01J 2237/3365
See application file for complete search history.

(56) References Cited

U.S. PATENT DOCUMENTS 5,497,006 A   3/1996  Sferlazzo et al.
9,153,405 B2  10/2015 Sato

FOREIGN PATENT DOCUMENTS

| JP | S60-065430 A | 4/1985 |
| JP | H08-227688 A | 9/1996 |
| JP | 2013-196985 A | 9/2013 |

*Primary Examiner* — Tracie Y Green
(74) *Attorney, Agent, or Firm* — Michael Best & Friedrich LLP

(57) ABSTRACT

A plasma generator includes: an arc chamber having a plasma generation region in which plasma is generated in the inside thereof; a magnetic field generator configured to apply a magnetic field to the plasma generation region; and a cathode configured to extend in an axial direction along an applying direction of the magnetic field applied to the plasma generation region and provided with a cathode cap that emits thermal electrons at a front end thereof. The cathode cap protrudes toward the inside of the arc chamber in the axial direction and has a shape of which a width in the radial direction perpendicular to the axial direction becomes smaller toward the inside of the arc chamber.

15 Claims, 9 Drawing Sheets

PLASMA GENERATOR AND THERMAL ELECTRON EMITTER

RELATED APPLICATION

Priority is claimed to Japanese Patent Application No. 2015-110349, filed on May 29, 2015, the entire content of which is incorporated herein by reference.

BACKGROUND OF THE INVENTION

1. Field of the Invention

The present invention relates to a thermal electron emitter and a plasma generator using the same.

2. Description of the Related Art

In a semiconductor manufacturing process, a process of implanting ions into a semiconductor wafer has been implemented as a standard process for the purpose of changing conductivity, for the purpose of changing a crystal structure of the semiconductor wafer, and for some other purposes. An apparatus used in this process is generally called an ion implanter.

In such an ion implanter, ions are generated by an ion source equipped with an indirectly heated cathode type plasma generator. The indirectly heated cathode type plasma generator heats a filament by allowing an electric current to flow through the filament to generate thermal electrons, and heats a cathode by the thermal electrons. Thermal electrons generated by the heated cathode are accelerated within an arc chamber and collided with source gas molecules in the arc chamber, so that atoms included in the source gas molecules are ionized to generate plasma. Some of ions in the generated plasma reach an outlet hole (front slit) of the arc chamber by diffusion and become an ion beam extracted by an electric field generated by an extracting electrode. Such a cathode for emitting thermal electrons may include, for example, a cathode cap heated by the thermal electrons emitted from the filament, and a tubular member of which an end is attached to the cathode cap.

Since the cap for emitting thermal electrons into the arc chamber is exposed to an internal space of the arc chamber, the cap is sputtered by ions in the plasma generated within the arc chamber and may wear down with the use of the ion source. Since it becomes difficult to stably generate ions as the cap gradually wears down, it is desirable to increase the thickness of the cap in order to extend the lifetime of the ion source. On the other hand, when the thickness of the cap is increased, an input energy amount necessary to sufficiently heat the cap and stably generate thermal electrons increases. When the energy amount necessary to heat the cap increases, the use of a power supply of higher power is needed and therefore, it may have influence on the cost of the ion source.

SUMMARY OF THE INVENTION

The present invention has been made in view of such a situation, and a purpose thereof is to provide a technology to improve device lifetime of a plasma generator and a thermal electron emitter and generation efficiency of plasma.

A plasma generator of an embodiment of the present invention includes: an arc chamber having a plasma generation region in which plasma is generated in the inside thereof; a magnetic field generator configured to apply a magnetic field to the plasma generation region; and a cathode extending in an axial direction along an applying direction of the magnetic field applied to the plasma generation region and provided with a cathode cap that emits thermal electrons at a front end thereof. The cathode cap protrudes toward the inside of the arc chamber in the axial direction and has a shape of which a width in the radial direction perpendicular to the axial direction becomes smaller toward the inside of the arc chamber.

Another embodiment of the present invention is a thermal electron emitter. The thermal electron emitter, which is a thermal electron emitter for emitting thermal electrons into the arc chamber having a plasma generation region to which a magnetic field is applied in the inside thereof, includes: a thermal break extending in an axial direction along an applying direction of the magnetic field applied to the plasma generation region; a cathode cap attached to a front end of the thermal break to emit thermal electrons into the arc chamber; and a filament provided inside of the thermal break to heat the cathode cap by thermal electrons. The cathode cap protrudes toward the inside of the arc chamber in the axial direction and has a shape of which a width in the radial direction perpendicular to the axial direction becomes smaller toward the inside of the arc chamber.

Optional combinations of the aforementioned constituting elements, and implementations of the present invention in the form of methods, apparatuses, or systems may also be practiced as additional modes of the present invention.

DETAILED DESCRIPTION OF THE INVENTION

Figure 1:
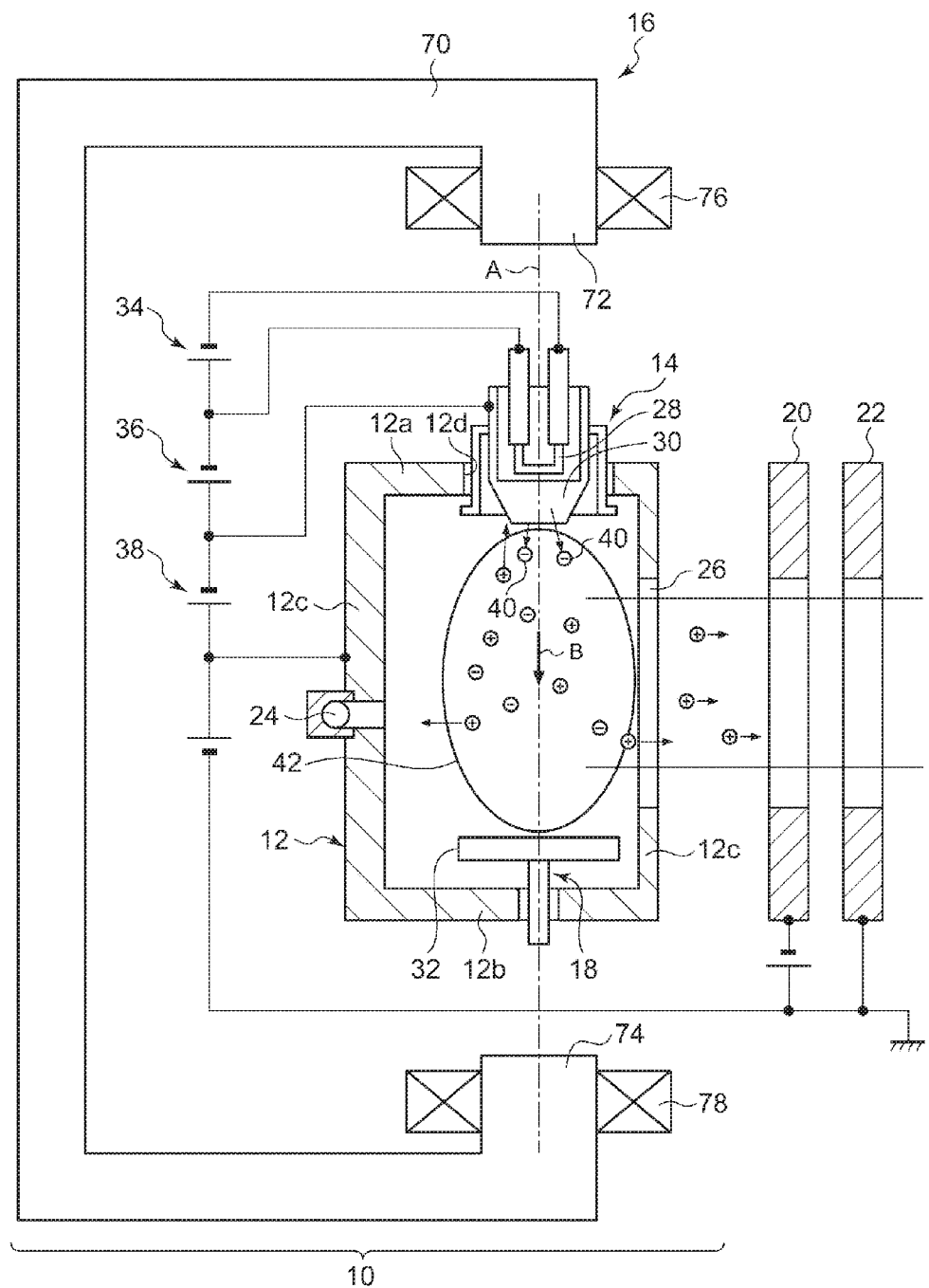
FIG. 1 is a diagram schematically illustrating a configuration of a plasma generator according to an embodiment of the present invention.

The invention will now be described by reference to the preferred embodiments. This does not intend to limit the scope of the present invention, but to exemplify the invention.

The invention will now be described by reference to the preferred embodiments. In the drawings, like reference characters designate like or corresponding elements, and the description thereof will not be repeated for brevity. A configuration described below does not intend to limit the scope of the present invention, but to exemplify the invention.

FIG. 1 is a diagram schematically illustrating a configuration of a plasma generator 10 according to an embodiment. The plasma generator 10 is an indirectly heated cathode type ion source and includes an arc chamber 12, a thermal electron emitter 14, a magnetic field generator 16, a repeller 18, and a variety of power supplies. A suppression electrode 20 for extracting ions from the inside of the arc chamber 12 and a ground electrode 22 are arranged in the vicinity of the plasma generator 10.

The magnetic field generator 16 includes a magnet yoke 70, a first magnet coil 76, and a second magnet coil 78. The magnet yoke 70 is provided such that the arc chamber 12 is disposed between a first magnetic pole 72 and a second magnetic pole 74 of the magnet yoke 70 which is provided outside of the arc chamber 12. For example, the first magnetic pole 72 is provided on the side of a cathode 30 and the second magnetic pole 74 is provided on the side of the repeller 18. Also, the magnet yoke 70 is provided such that the cathode 30 and the repeller 18 are arranged on a central axis A connecting the first magnetic pole 72 and the second magnetic pole 74.

The first magnet coil 76 is provided in the vicinity of the first magnetic pole 72, and the second magnet coil 78 is provided in the vicinity of the second magnetic pole 74. The first magnet coil 76 and the second magnet coil 78 are energized such that, for example, the first magnetic pole 72 becomes an N pole and the second magnetic pole 74 becomes an S pole. In this way, the magnetic field generator 16 applies a magnetic field B directing from the first magnetic pole 72 to the second magnetic pole 74 to an internal space of the arc chamber 12. The magnetic field generator 16 generates the magnetic field B in the direction along the central axis A in the vicinity of the central axis A. Also, the magnetic field generator 16 may apply a magnetic field in a direction slightly deviated from the direction along the central axis A, at a position spaced apart from the central axis A.

In the following description, a direction in which the magnetic field B generated by the magnetic field generator 16 is applied is referred to as an axial direction and a direction perpendicular to the axis direction is referred to a radial direction. Therefore, it can be said that the axial direction is the direction along the central axis A connecting the first magnetic pole 72 and the second magnetic pole 74 of the magnetic field generator 16.

The arc chamber 12 has a substantially rectangular parallelepiped shape. The arc chamber 12 is made of a high melting point material, such as a high melting point metal, including tungsten (W), molybdenum (Mo), and tantalum (Ta), an alloy of those, graphite (C), or the like. Therefore, even in an environment where the temperature in the arc chamber becomes relatively high, the arc chamber would be hard to melt.

The arc chamber 12 includes an upper surface plate 12a, a lower surface plate 12b, and side wall plates 12c. On the side wall plate 12c are formed a gas introducing port 24 that introduces a source gas, and a front slit 26 that is an opening through which an ion beam is extracted. Also, the thermal electron emitter 14 is provided through the upper surface plate 12a, and the repeller 18 is inserted through the lower surface plate 12b.

The arc chamber 12 is arranged such that the side wall plate 12c extends in the axial direction, and is arranged such that the upper surface plate 12a faces the lower surface plate 12b in the axial direction. Therefore, a direction from the upper surface plate 12a toward the lower surface plate 12b can be also referred to as the axial direction. Also, in the following description, the internal part of the arc chamber 12 is also referred to as the inside, and the external part of the arc chamber 12 is referred to as the outside.

The thermal electron emitter 14, which emits a thermal electron into the arc chamber, includes a filament 28 and a cathode 30. The thermal electron emitter 14 is inserted into an attachment hole 12d in the upper surface plate 12a and fixed so as to be insulated from the arc chamber 12.

The filament 28 is heated by a filament power supply 34 and generates thermal electrons at a front end thereof. The primary thermal electrons generated from the filament 28 are accelerated in a cathode electric field generated by a cathode power supply 36, so as to be collided with the cathode 30, which is heated with the heat generated by the energy of the collision. Thereafter, the heated cathode 30 generates secondary thermal electrons 40, which are accelerated by an arc voltage applied between the cathode 30 and the arc chamber 12 by an arc power supply 38. The accelerated secondary thermal electrons 40 are emitted into the arc chamber 12 as beam electrons having sufficient energy for ionizing gas molecules to generate plasma.

The beam electrons, which are emitted into the arc chamber 12, are restrained with the magnetic field B applied to the inside of the arc chamber 12 in the axial direction and helically move along the magnetic field B. By allowing the electrons to helically move within the arc chamber 12, it is possible to restrict movement of the electrons to a position where the plasma 42 is generated, thereby improving generation efficiency of plasma. Also, a region in which the plasma 42 is generated is referred to as a "plasma generation region". The plasma generation region corresponds to at least a part of the internal space of the arc chamber 12.

The repeller 18 is mounted on the lower surface plate 12b so as to be insulated from the arc chamber 12. The repeller 18 includes a repeller plate 32. The repeller plate 32 is provided at a position facing the thermal electron emitter 14 in the axial direction such that the position where the plasma 42 is generated is interposed therebetween, and is also provided to face the cathode 30 and to be almost parallel thereto. The repeller plate 32 repels electrons within the arc chamber to keep the electrons at the plasma generation region where plasma 42 is generated, thereby improving the generation efficiency of plasma.

Figure 2:
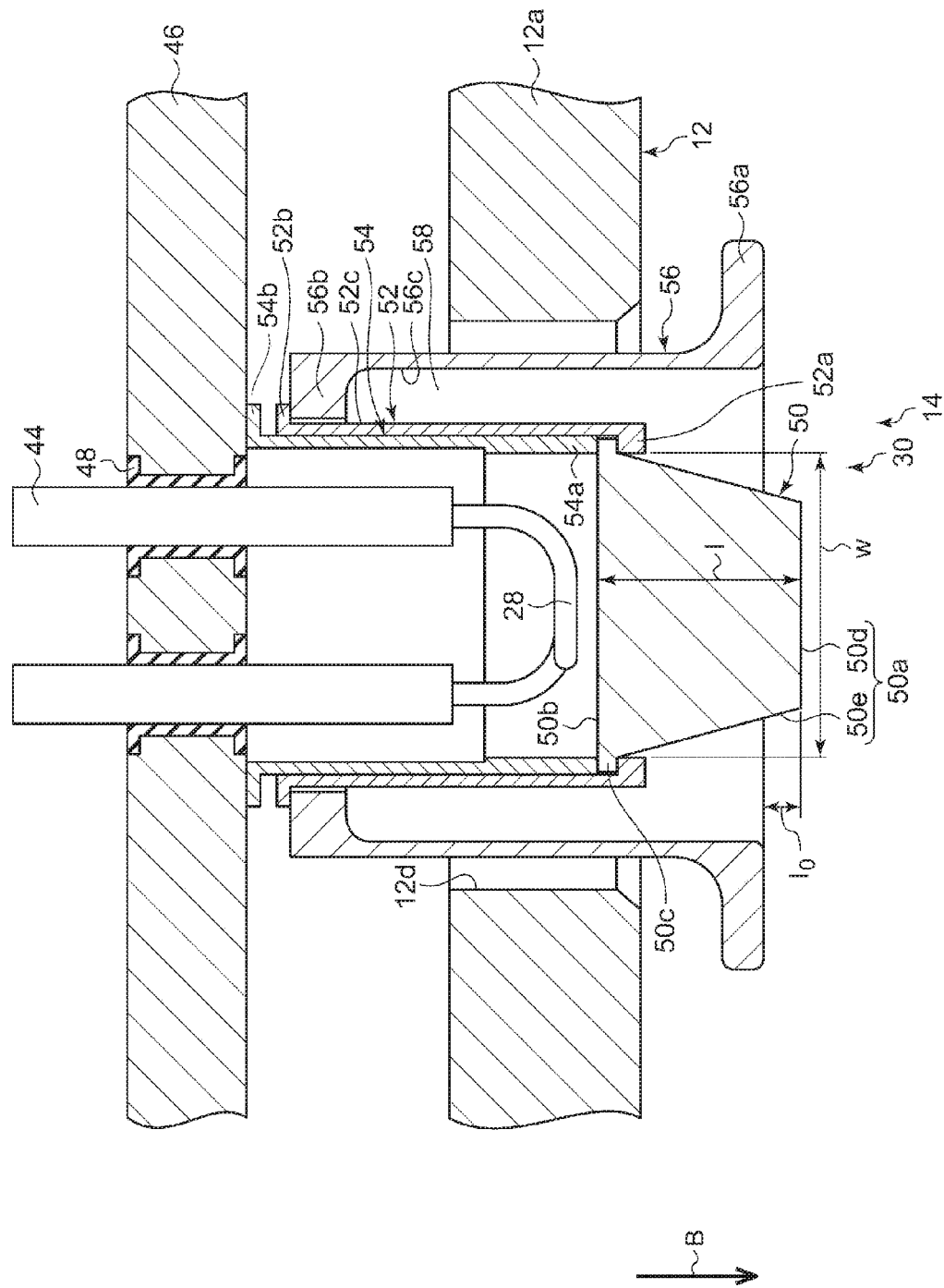
FIG. 2 is a cross-sectional view illustrating a configuration of a thermal electron emitter according to an embodiment of the present invention.

Next, the configuration of the thermal electron emitter 14 will be detailed with reference to FIG. 2. FIG. 2 is a cross-sectional view illustrating a configuration of the thermal electron emitter 14 according to the embodiment.

The thermal electron emitter 14 includes the filament 28, the cathode 30, and a thermal reflector 56. The cathode 30 includes a cathode cap 50, a thermal break 52, and a cathode retainer 54. The thermal electron emitter 14 is inserted through the attachment hole 12d with a gap to the inner wall of the attachment hole 12d so as not to be in contact with the upper surface plate 12a of the arc chamber 12, and is fixed to an attachment plate 46. The cathode 30 and thermal reflector 56 have the same potential that is an arc potential which is different from a potential applied to the arc chamber 12.

The cathode cap 50 is a member that is heated by the thermal electrons emitted from the filament 28 to emit the thermal electrons into the arc chamber and is made of a high melting point material, including tungsten (W), tantalum (Ta), and graphite (C), for example. The cathode cap 50 is a solid member protruding towards the internal space of the arc chamber 12 in the axial direction. Also, the cathode cap 50 includes a thermal electron emitting surface 50a exposed to the internal space of the arc chamber 12, a heat inflow surface 50b facing the filament 28, and a flange 50c protruding outward in the radial direction.

The cathode cap 50 has a rotationally symmetric shape with respect to the central axis extending in the axial direction (for example, the central axis A in FIG. 1), and a shape of which a width in the radial direction (corresponding to the full width w at a position in the vicinity of a flange 50c, for example) becomes gradually smaller toward the inside of the arc chamber 12. Also, the cathode cap 50 has a shape of which a length l in the axial direction is equal to or longer than ½ of the full width w in the radial direction. The cathode cap 50 has, for example, a truncated conical shape as illustrated, and has a shape of which a length l is about 0.5 times to 0.9 times the full width w.

The thermal electron emitting surface 50a has a front surface 50d constituted of a plane surface perpendicular to the axial direction and a side surface 50e constituted of a conical surface. According to the present embodiment, the thermal electron emitting surface 50a is constituted of a plane surface and a curved surface in a direction intersecting with the axial direction that is the applying direction of the magnetic field B. In particular, the side surface 50e of the cathode cap 50 is configured to have a curved surface obliquely intersecting with the axial direction.

Figure 3:
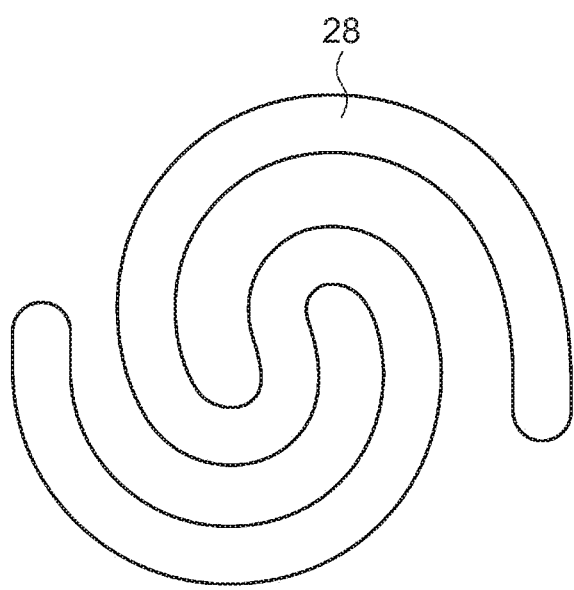
FIG. 3 is a plan view illustrating a configuration of a filament according to an embodiment of the present invention.

The heat inflow surface 50b is constituted of a plane surface perpendicular to the axial direction and is arranged such that a distance from the filament 28 with a spiral shape as illustrated in FIG. 3 is uniform. Therefore, the cathode cap 50 is uniformly heated by primary thermal electrons emitted from the filament 28.

The flange 50c is provided at a position of the heat inflow surface 50b or in the vicinity thereof. The flange 50c is latched by being interposed between the thermal break 52 and the cathode retainer 54. Therefore, the cathode cap 50 is fixed to ends of the thermal break 52 and the cathode retainer 54 and protrudes from the ends of the thermal break 52 and the cathode retainer 54 toward the internal space of the arc chamber 12.

The thermal break 52 is a cylindrical member that extends inward from the outside of the arc chamber 12 in the axial direction and fixes the cathode cap 50. The thermal break 52 has, for example, a cylindrical shape corresponding to the shape of the cathode cap 50. Also, the thermal break 52 is made of a high melting point material, including tungsten (W) and tantalum (Ta), for example.

The thermal break 52 has the latch end 52a for latching the cathode cap 50, and an attachment end 52b used for attaching itself to the attachment plate 46 provided outside of the arc chamber 12. The attachment end 52b may be directly attached to the attachment plate 46 or may be indirectly attached to the attachment plate 46 via the cathode retainer 54. Namely, the thermal break 52 may be fixed to the cathode retainer 54 at the attachment end 52b.

In order to maintain the cathode cap 50 in a high temperature state, the thermal break 52 desirably has a shape exhibiting good thermal insulation properties i.e. low thermal conductivity, such as a shape that is long in the axial direction and has a small wall thickness. The thermal break 52 having such a shape can improve the thermal insulation properties between the cathode cap 50 and attachment plate 46. Accordingly, the cathode cap 50 heated by the thermal electrons emitted from the filament 28 is less likely to transfer heat toward the attachment plate 46 via the thermal break 52.

The cathode retainer 54 is a member that is provided inside the thermal break 52 and has a cylindrical shape extending in the axial direction along the thermal break 52. The cathode retainer 54 is made of a high melting point material, including tungsten (W) and tantalum (Ta), for example. Also, the cathode retainer 54 has a fixing end 54a for fixing the cathode cap 50, and an attachment end 54b used for attaching itself to the attachment plate 46. As with the thermal break 52, the cathode retainer 54 also desirably has a shape that is long in the axial direction and has a small wall thickness for good thermal insulation properties.

The filament 28 is connected to two lead electrodes 44, which are fixed to the attachment plate 46 provided outside of the arc chamber 12 via insulation parts 48. FIG. 3 is a plan view illustrating the shape of the filament 28 when viewed from the inside of the arc chamber in the axial direction. As illustrated, the filament 28 is formed by spirally bending a tungsten wire. As illustrated in FIG. 2, the filament 28 is arranged to face the heat inflow surface 50b of the cathode cap 50 at a fixed distance.

The filament 28 is provided within the cathode 30 composed of the cathode cap 50, thermal break 52, and cathode retainer 54. Accordingly, the filament 28 is separated from plasma generated in the internal space of the arc chamber 12, thereby preventing deterioration of the filament 28.

The thermal reflector 56 is provided around the cathode cap 50 and thermal break 52 outward in the radial direction and has a cylindrical shape facing an outer surface 52c of the thermal break 52 and extending in the axial direction. The thermal reflector 56 is made of a high melting point material, such as tungsten (W), tantalum (Ta), and graphite (C) for example. Also, the thermal reflector 56 has an open end 56a that extends outward in the radial direction near the front surface 50d of the cathode cap 50, and a connection end 56b that extends inward in the radial direction near the attachment end 52b of the thermal break 52 so as to be connected to the thermal break 52.

The thermal reflector 56 reflects radiation heat emitted from the cathode cap 50 and the thermal break 52 in a high temperature state, thereby maintaining the cathode cap 50 and the thermal break 52 at a high temperature. The thermal reflector 56 desirably extends to a position facing the side surface 50e of the cathode cap 50 in the axial direction so as to be able to reflect radiation heat from the side surface 50e. In other words, the thermal reflector 56 desirably extends in the axial direction toward the inside of the arc chamber 12 beyond the thermal break 52 that latches the cathode cap 50. The thermal reflector 56 desirably extends in the axial direction toward the inside of the arc chamber 12 beyond a position where, for example, at least a half-length of the cathode cap 50 in the axial direction is surrounded with the thermal reflector 56.

Also, when comparing the arrangement of the cathode cap 50 with the thermal reflector 56, a front end of the cathode cap 50 further protrudes toward the inside of the arc chamber 12 than the end of the thermal reflector 56. Therefore, the cathode cap 50 can efficiently emit the thermal electrons, which are emitted from the side surface 50e close to the front end of the cathode cap 50, toward the inside of the arc chamber 12. A protrusion amount of the cathode cap 50, that is, a length $l_0$ in the axial direction from the open end 56a of the thermal reflector 56 to the front end of the cathode cap 50 is desirably equal to or longer than 10% of the length l of the cathode cap 50 in the axial direction, and is more desirably about 15% to 30% of the length l of the cathode cap 50 in the axial direction.

Also, the thermal reflector 56 is desirably attached to the thermal break 52 in the vicinity of the attachment end 52b of the thermal break 52. In other words, the thermal reflector 56 is desirably attached to a position spaced apart from the cathode cap 50 and the latch end 52a of the thermal break 52 such that the thermal break 52 is covered by the thermal reflector 56. On the other hand, when the thermal reflector 56 is attached near the cathode cap 50 and the latch end 52a of the thermal break 52, the temperature of the thermal break 52 is lowered due to heat loss caused by radiant heat, and therefore, the heat of the cathode cap 50 becomes easy to escape to the thermal break 52, thereby causing a decrease in temperature of the cathode cap 50.

In the plasma generator 10 having the aforementioned configuration, the cathode cap 50 is heated by thermal electrons emitted by the filament 28, and emits thermal electrons from the thermal electron emitting surface 50a. The thermal electrons emitted from the cathode cap 50 are accelerated by an arc voltage applied between the cathode 30 and the arc chamber 12, and are then introduced into the arc chamber 12 as beam electrons. The introduced beam electrons reciprocate between the cathode 30 and the repeller 18 which are illustrated in FIG. 1, and simultaneously move while drawing a spiral orbit along the magnetic field B in the axial direction.

The reciprocating beam electrons then collide with and ionize source gas molecules introduced into the arc chamber 12 to generate the plasma 42 in the arc chamber 12. Since the beam electrons mostly exist within a range restricted by the applied magnetic field B, the plasma are mainly generated within the range. Ions in the generated plasma then reach, by diffusion, the inner wall of the arc chamber 12, the front slit 26, the cathode 30, and the repeller 18. The ions which have reached the front slit 26 are accelerated through the suppression electrode 20 that is an extracting electrode and the ground electrode 22, and are extracted from the arc chamber 12.

As the source gas, there is used a noble gas, hydrogen ($H_2$), a hydride such as phosphine ($PH_3$) or arsine ($AsH_3$), or a halide including a fluoride such as boron trifluoride ($BF_3$) or germanium tetrafluoride ($GeF_4$) and a chloride such as indium trichloride ($InCl_3$) and an iodide such as indium triiodide ($InI_3$). In addition, a substance containing an oxygen atom (O), such as carbon dioxide ($CO_2$), carbon monoxide (CO), and oxygen ($O_2$), may also be used for the source gas. Such a source gas is introduced into the arc chamber 12 via the gas introducing port 24 and ionized by the beam electrons consisted of the secondary thermal electrons 40. However, when ions energized by the arc voltage and/or plasma potential are incident on and collided with the inner wall of the arc chamber 12, the cathode 30, or the repeller 18, they cause wear of a constituent material (W, Ta, Mo, graphite, or the like) of each component by sputtering or chemical etching.

When a substance containing a fluorine atom or an oxygen atom is used as a source gas, there are generated fluorine radicals or oxygen radicals having high reactivity within the arc chamber. The generated fluorine radical or oxygen radical causes corrosive wear of a constituent material (W, Ta, Mo, graphite, or the like) of each component of the plasma generator 10. Particularly, around the cathode 30 placed in a high temperature state, the degree of corrosive wear caused by the oxygen radicals or the fluorine radicals is significant, and the thermal electron emitting surface 50a of the cathode cap 50 and the thermal cap 56 exposed to the internal space of the arc chamber 12 are worn out with ion source operation. When the thermal electron emitting surface 50a and the thermal reflector 56 are worn out, stable plasma generation is difficult, and therefore, maintenance, such as replacement of the damaged cathode 30, is needed. As a result, frequent maintenance will reduce the operation availability of the plasma generator 10, causing deterioration of productivity in the process using the ion implanter and increase in maintenance cost.

Also, a substance sputtered and scattered by the generated fluorine radicals or oxygen radicals adheres to surfaces of elements provided within the arc chamber 12, and is deposited as a substance having relatively high thermal conductivity, such as W, Ta, Mo, or C. When such a substance having high thermal conductivity adheres to the thermal break 52, thermal conductivity will become high, and the thermal insulation properties of the thermal break 52 will be degraded. Consequently, increased electric power must be supplied to the filament 28 in order to maintain the temperature of the cathode cap 50. Generally, since the capacity of the filament power supply 34 has an upper limit, if the thermal insulation properties of the thermal break 52 are significantly degraded, it may be unable to maintain the cathode cap 50 at a required temperature even if the maximum amount of electric power is supplied from the filament power supply. Accordingly, maintenance, such as replacement of the thermal break 52 is required, and the operation availability of the plasma generator 10 is reduced. Therefore, even if the thermal insulation properties of the thermal break 52 is degraded, it is desirable to maintain a state necessary for plasma generation with less heat inflow so as to be able to sufficiently heat the cathode cap 50 to emit thermal electrons.

In the present embodiment, by making a length l of the cathode cap 50 equal to or thicker than ½ of the full width w, the durability of the cathode cap 50 is improved. Also, the thermal electron emitting surface 50a of the cathode cap 50 is constituted of a plane or curved surface intersecting with the applying direction (axial direction) of the magnetic field B, and therefore, emitted thermal electrons are efficiently supplied into the arc chamber 12. Next, an action in which the thermal electrons are efficiently supplied to the inside of the arc chamber 12 in the present embodiment will be described by using the comparative example.

Figure 4:
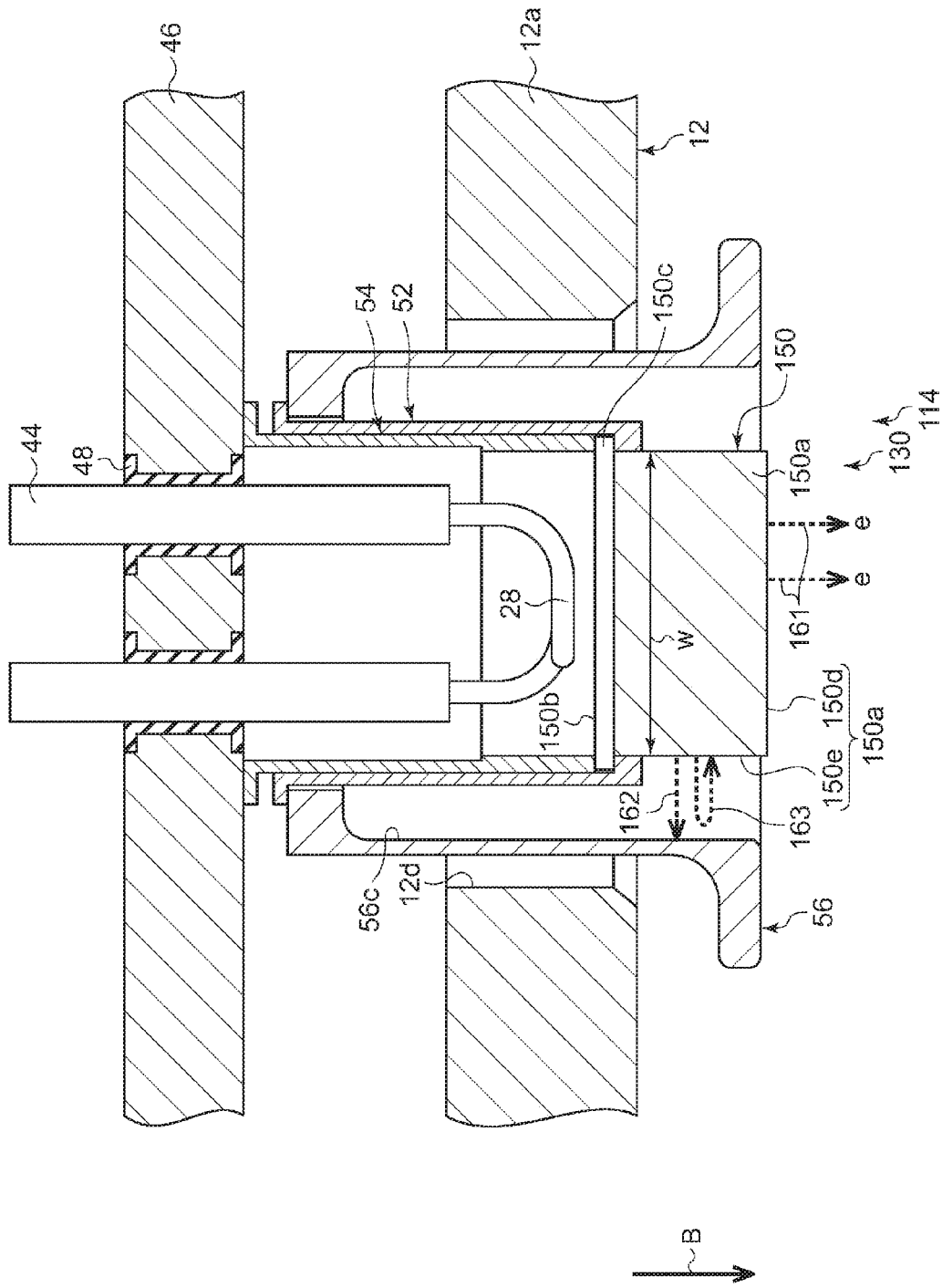
FIG. 4 is a cross-sectional view illustrating a configuration of a thermal electron emitter according to a comparative example.

FIG. 4 is a cross-sectional view illustrating a configuration of a thermal electron emitter 114 according to a comparative example. The thermal electron emitter 114 differs from the aforementioned embodiment in that a cathode cap 150 of a cathode 130 has a cylindrical shape, but is similar to the aforementioned embodiment in the other configurations. Next, the comparative example will be described while focusing on the difference from the aforementioned embodiment.

The cathode cap 150 has a cylindrical shape unlike the cathode cap 50 according to the aforementioned embodiment. In other words, the cathode cap 150 has a shape of which a width w in a radical direction is uniform along the axial direction in which the magnetic field B is applied. The thermal electron emitting surface 150a is constituted of a front surface 150d which is a plane surface intersecting with the axial direction and a side surface 150e which is a cylindrical surface extending in the axial direction. The side surface 150e is a curved surface which is parallel to the axial direction.

Generally, a region called a "plasma sheath" exists in an interface where plasma and a member surface contact each other. Even in the surface of the cathode cap 150 contacting the plasma 42, there is a plasma sheath. Due to the plasma sheath, an electric field is generated in a direction perpendicular to the thermal electron emitting surface 150a in the vicinity thereof. Thermal electrons emitted from the cathode cap 150 are accelerated by the electric field in the plasma sheath generated in the vicinity of the thermal electron emitting surface 150a. Therefore, the thermal electrons emitted from the thermal electron emitting surface 150a are accelerated in the direction perpendicular to the thermal electron emitting surface 150a. For example, the thermal electrons emitted from the front surface 150d are emitted in the axial direction as indicated by arrows 161 and are directed to the inside of the arc chamber 12.

On the other hand, the thermal electrons emitted from the side surface 150e are emitted outward in the radial direction as indicated by an arrow 162. The thermal electron having a velocity component in the radial direction receives Lorentz force by the magnetic field B in the axial direction and circularly moves in the plane perpendicular to the axial direction. As a result, the thermal electrons emitted from the side surface 150e collide with an inner peripheral surface 56c of the thermal reflector 56, or, as indicated by an arrow 163, the thermal electrons return back to the cathode cap 150 and collide with the cathode cap 150 to disappear. Thus, most of the thermal electrons, which are emitted from the side surface 150e of the cathode cap 150 according to the present comparative example, disappear without being directed toward the inside of the arc chamber 12, and do not contribute to the generation of plasma in the arc chamber 12.

When the cathode cap 150 has a shape which is thin in the axial direction, there may not be caused significant problems although the thermal electrons, which are emitted from the side surface 150e do not contribute to the generation of plasma. However, when it is attempted to increase the thickness in the axial direction in order to improve durability of the cathode cap 150, the ratio of the side surface 150e occupied in the thermal electron emitting surface 150a becomes larger. When the area of the side surface 150e increases, the amount of radiant heat from the thermal electron emitting surface 150a increases, thereby resulting in an increase of the input energy amount necessary to maintain the temperature of the cathode cap 150. On the other hand, since the area of the front surface 150d capable of emitting the thermal electrons which contribute to the generation of plasma is not changed, the emission amount of the thermal electrons with respect to the input energy is reduced. That is, when the thickness of the cathode cap 150 in the axial direction is increased with its cylindrical shape maintained as it is, the supply efficiency of the thermal electrons to the inside of the arc chamber 12 is degraded.

Figure 5:
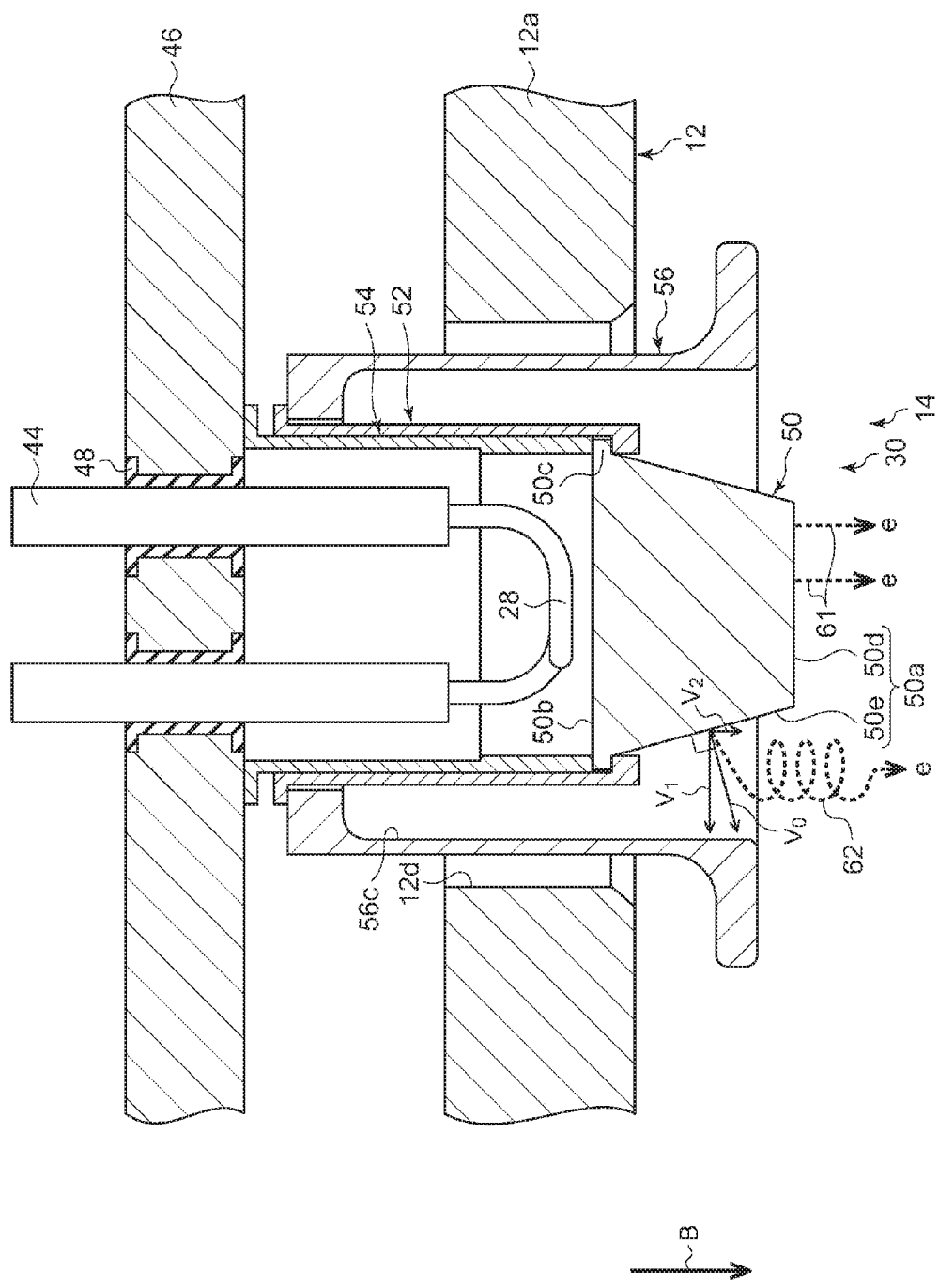
FIG. 5 is a diagram schematically illustrating effect achieved by the thermal electron emitter according to an embodiment of the present invention.

FIG. 5 is a diagram schematically illustrating effect achieved by the thermal electron emitter 14 according to an embodiment. The thermal electrons emitted from the front surface 50d of the cathode cap 50 are directed to the inside of the arc chamber 12 as indicated by an arrow 61 with an initial velocity $V_0$. Also, the thermal electrons emitted from the side surface 50e has an initial velocity $V_0$ in a direction perpendicular to the side surface 50e, and has a velocity component $V_1$ in the radial direction and a velocity component $V_2$ in the axial direction. The thermal electrons emitted from the side surface 50e circularly move due to Lorentz force caused by the velocity component $V_1$ in the radial direction and move in the axial direction at the velocity $V_2$. Therefore, as indicated by an arrow 62, the thermal electrons emitted from the side surface 50e can be directed to the inside of the arc chamber 12 while drawing a spiral orbit along the applying direction of the magnetic field B. In the present embodiment, by configuring the side surface 50e to be inclined to the axial direction, it is possible to allow the thermal electrons emitted from the side surface 50e to be directed to the inside of the arc chamber 12, thereby contributing to the generation of plasma.

Also, according to the present embodiment, by configuring the cathode cap 50 to have a truncated conical shape, it is possible to reduce the ratio of an area of the thermal electron emitting surface with respect to the volume of the cathode cap (specific surface area), compared to the cathode cap 150 having a cylindrical shape. Since the amount of radiant heat, which is lost from the thermal electron emitting surface, is proportional to the size of a surface area, heat loss caused by radiant heat from the cathode cap 50 having a truncated conical shape is smaller than that in the cathode cap 150 having a cylindrical shape. As a result, in the case of making the cathode cap 50 and the cathode cap 150 equal to each other in volume, it is possible to reduce an input energy amount necessary to maintain an appropriate temperature for the sake of emitting thermal electrons, compared to the comparative example.

Also, according to the present embodiment, by configuring the cathode cap 50 to have a truncated conical shape, it is possible to reduce a difference in distances from a central part facing the filament 28 in the heat inflow surface 50b to respective positions on the thermal electron emitting surface 50a. Accordingly, it reduces a difference in the amount of heat which is input from the filament 28 and is transferred to the respective positions on the thermal electron emitting surface 50a, thereby uniformly heating the thermal electron emitting surface 50a. In this way, it is possible to suppress the temperature unevenness of the thermal electron emitting surface 50a and reduce an input energy amount necessary to emit thermal electrons from the full surface of the thermal electron emitting surface 50a, compared to the comparative example.

Also, according to the present embodiment, in the case of making the cathode cap 50 and the cathode cap 150 equal to each other in volume and configuring the heat inflow surfaces 50b and 150b to have the same shape, it is possible to increase the length l in the axial direction, compared to the comparative example. Therefore, it is possible to improve the wear resistance of the cathode cap 50 while suppressing an increase in an energy amount necessary to heat the cathode cap 50. In particular, the central part of the cathode cap 50 has a higher plasma density than a peripheral part close to the thermal reflector 56, and is susceptible to wear down by plasma. Therefore, by increasing the thickness of the central part of the cathode cap 50, the durability of the cathode cap 50 can be efficiently improved.

As described above, according to the present embodiment, the cathode cap 50 is configured to have a truncated conical shape, thereby reducing the energy amount necessary to heat the cathode cap 50 and simultaneously allowing the thermal electrons emitted from the side surface 50e to contribute to the generation of plasma. Further, it is possible to improve durability of the cathode cap 50 by increasing the length l of the central part of the cathode cap 50 in the axial direction. Therefore, according to the present embodiment, it is possible to improve the device lifetime of the thermal electron emitter 14, which is dependent on the cathode cap 50, and simultaneously improve generation efficiency of plasma in the plasma generator 10.

(Modification 1)

Figure 6:
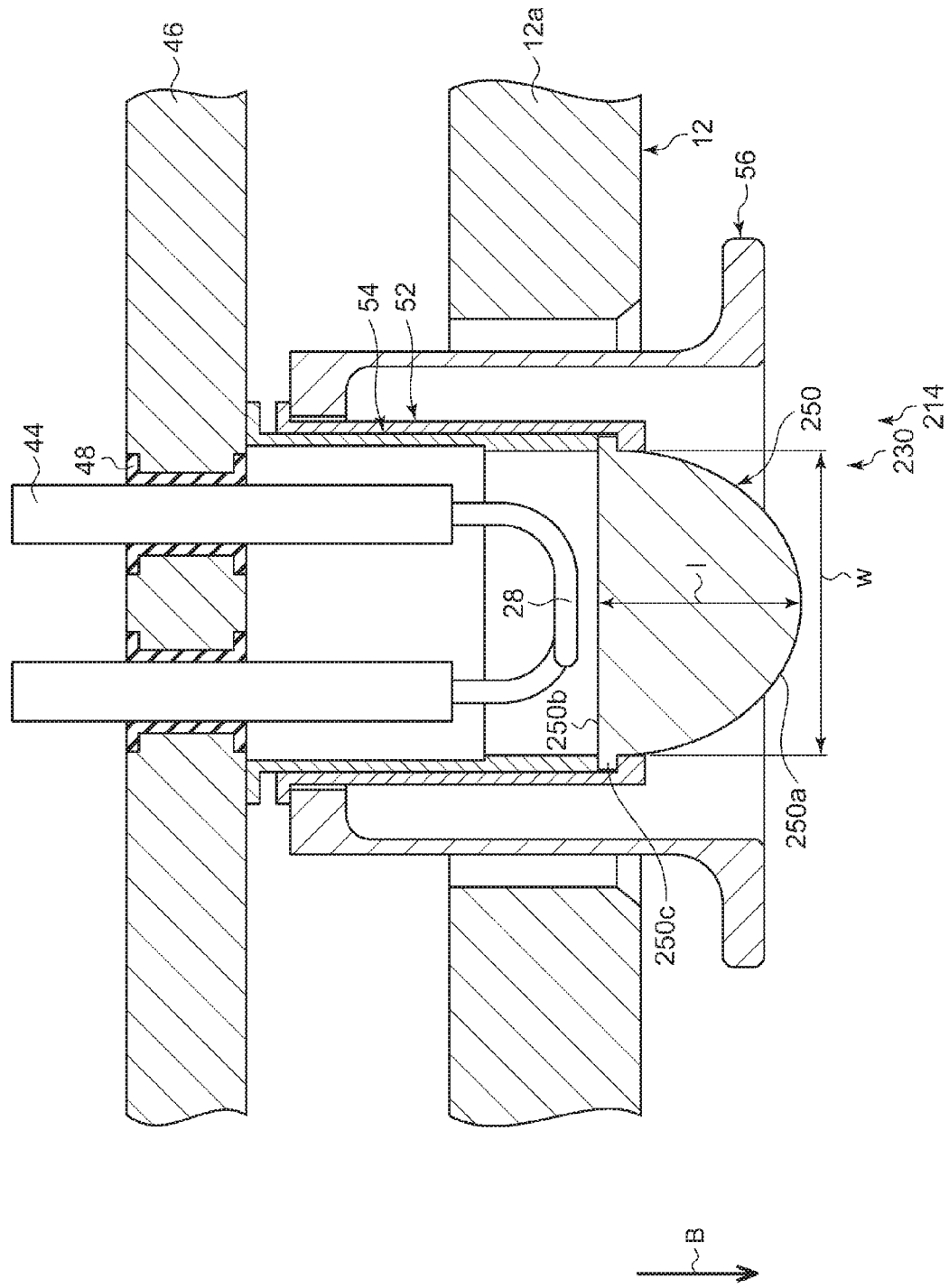
FIG. 6 is a cross-sectional view illustrating a configuration of a thermal electron emitter according to a modification.

FIG. 6 is a cross-sectional view illustrating a configuration of a thermal electron emitter 214 according to a modification. A cathode 230 according to the modification differs from that of the aforementioned embodiment in that the cathode 230 includes a cathode cap 250 having a hemispherical shape. Next, the present modification will be described while focusing on the difference from the aforementioned embodiment.

The cathode cap 250 includes a thermal electron emitting surface 250a, a heat inflow surface 250b, and a flange 250c. The cathode cap 250 has a hemispherical shape or a shape obtained by cutting a part of a sphere or spheroid, as illustrated. Therefore, the cathode cap 250 has a shape of which a width w in the radial direction becomes gradually smaller toward the inside of the arc chamber 12. The thermal electron emitting surface 250a is constituted of a convex curved surface, such as a spherical surface or an spheroidal surface, and a curved surface in a direction intersecting with an axial direction which is an applying direction of magnetic field B.

Also in the present modification, it is possible to obtain the same effect as the aforementioned embodiment. For example, in the case of configuring the cathode cap 150 according to the comparative example to have a cylindrical shape with a diameter w of 12 mm and a length l of 8 mm, in the cathode cap 250 having the almost same volume as the comparative example having a shape obtained by cutting a spheroid in half, the area of the thermal electron emitting surface 250a is reduced by about 7%. Therefore, under the same plasma generation conditions, the energy amount necessary to heat the cathode cap 250 can be reduced by about 7%. Also, since the length l of the cathode cap 250 under the same conditions is increased by about 50% compared to the comparative example, it is possible to extend a time period during which the cathode cap 250 wears down, by about 50%.

(Modification 2)

Figure 7:
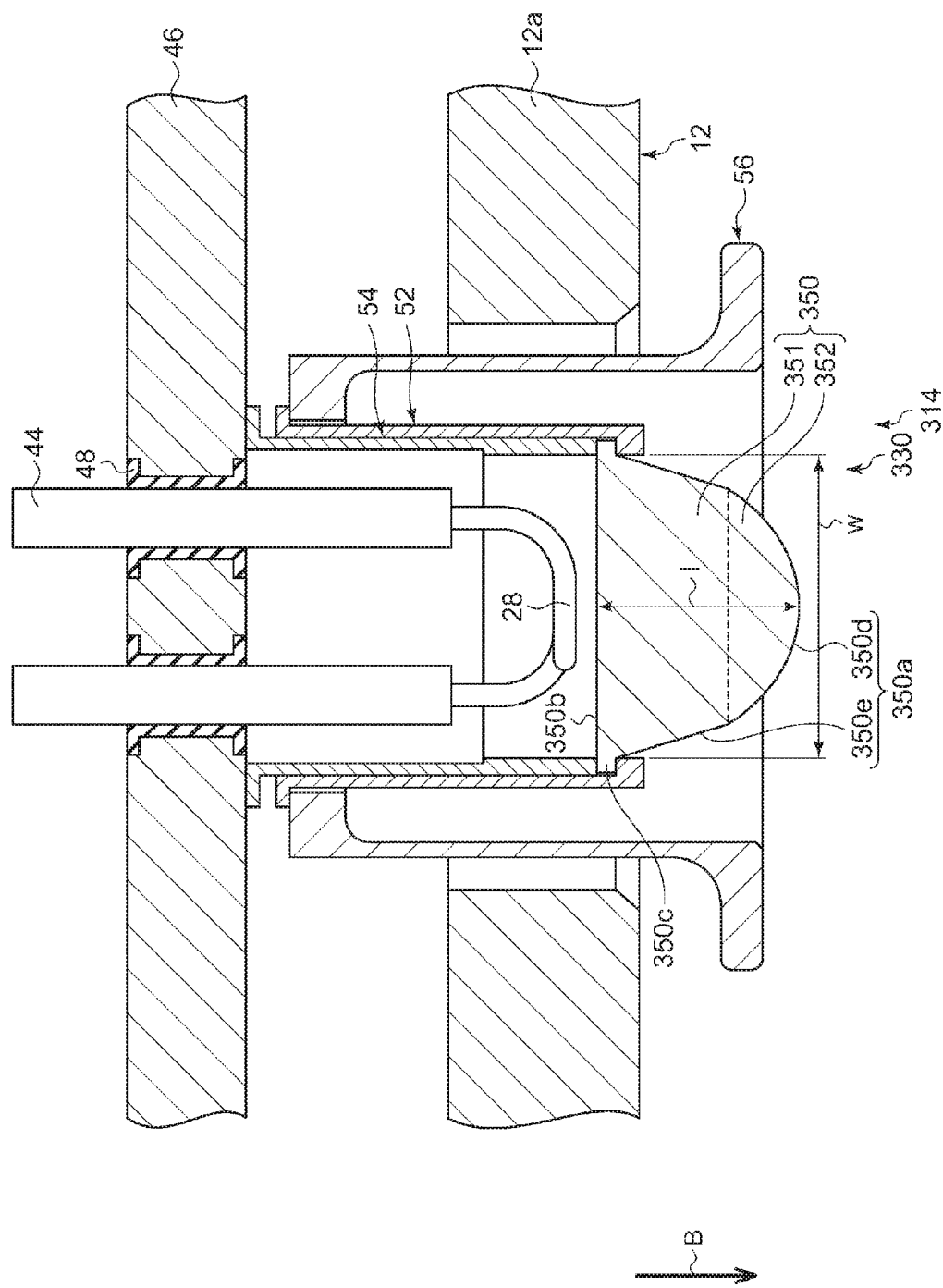
FIG. 7 is a cross-sectional view illustrating a configuration of a thermal electron emitter according to a modification.

FIG. 7 is a cross-sectional view illustrating a configuration of a thermal electron emitter 314 according to a modification. A cathode 330 according to the modification differs from that of the aforementioned embodiment in that the cathode 330 includes a cathode cap 350 having a shape in which a convex curved surface is added to an upper surface of a truncated cone. Next, the present modification will be described while focusing on the difference from the aforementioned embodiment.

The cathode cap 350 includes a first portion 351 having a truncated conical shape, and a second portion 352 having a shape obtained by cutting apart of a sphere. The first portion 351 has a heat inflow surface 350b facing a filament 28, a side surface 350e constituted of a conical surface, and a flange 350c protruding from the heat inflow surface 350b outward in the radial direction. The second portion 352 has a front surface 350d constituted of a convex curved surface, such as a spherical surface or an spheroidal surface. The side surface 350e of the first portion 351 and the front surface 350d of the second portion 352 constitute the thermal electron emitting surface 350a of the cathode cap 350.

Also in the present modification, the cathode cap 350 has a shape of which a width w in the radial direction becomes gradually smaller toward the inside of the arc chamber 12. The thermal electron emitting surface 350a is constituted of curved surfaces in a direction intersecting with an axial direction which is an applying direction of a magnetic field B. Therefore, the present modification can obtain the same effect as the aforementioned embodiment.

(Modification 3)

Figure 8:
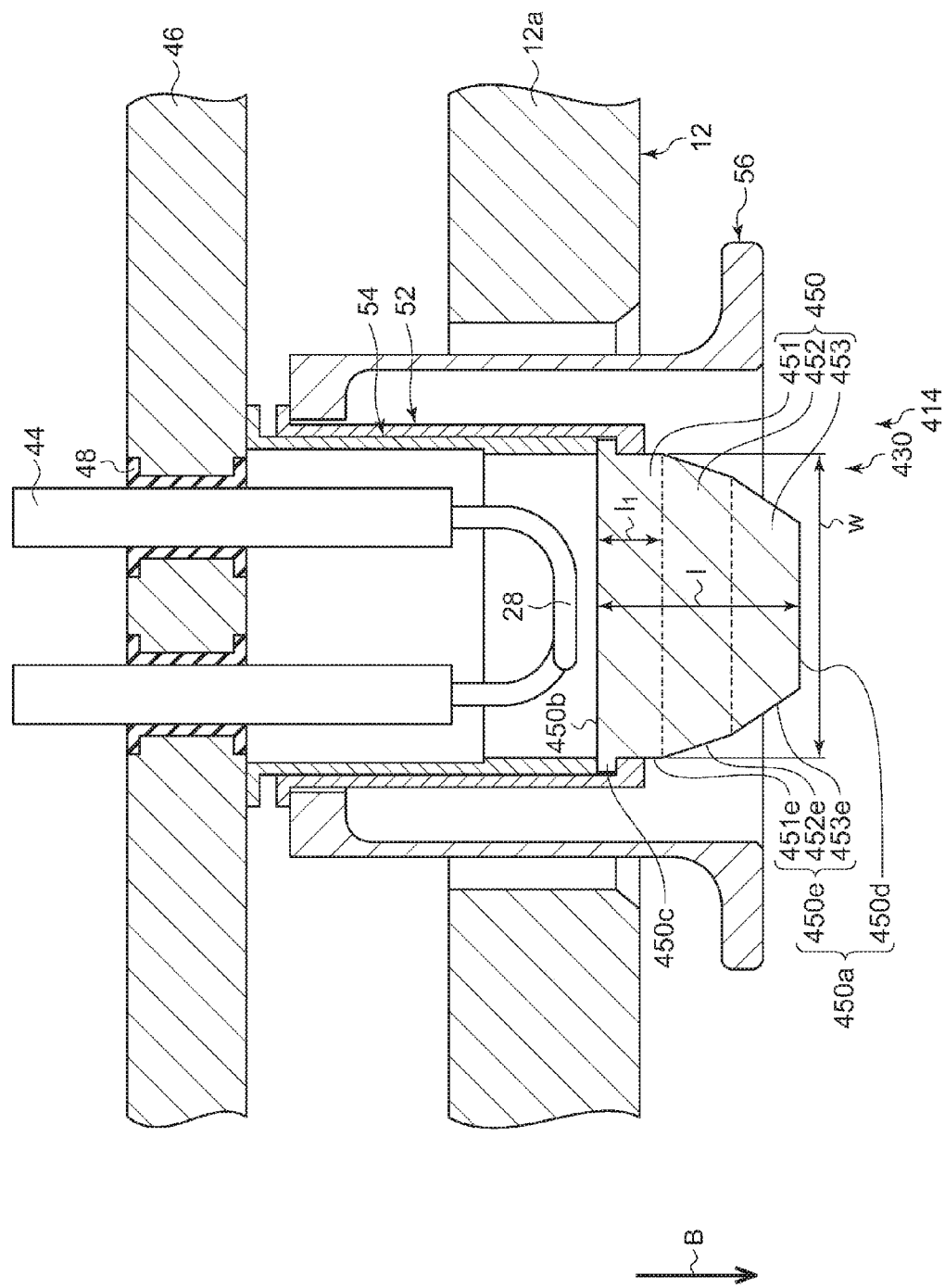
FIG. 8 is a cross-sectional view illustrating a configuration of a thermal electron emitter according to a modification.

FIG. 8 is a cross-sectional view illustrating a configuration of a thermal electron emitter 414 according to a modification. A cathode 430 according to the present modification differs from the aforementioned embodiment in that the cathode 430 includes a cathode cap 450 having rotationally symmetric shape in which an inclination of a side surface 450e with respect to the axial direction is changed in a stepwise manner. Next, the present modification will be described while focusing on the difference from the aforementioned embodiment.

The cathode cap 450 includes a first portion 451 having a cylindrical shape, and a second portion 452 having a truncated conical shape and a third portion 453, which have a truncated conical shape. The first portion 451, the second portion 452, and the third portion 453 are sequentially stacked toward the inside of the arc chamber 12. The first portion 451 has a heat inflow surface 450b facing a filament 28, a first side surface 451e constituted of a cylindrical surface, and a flange 450c protruding from the heat inflow surface 450b outward in the radial direction. The second portion 452 has a second side surface 452e constituted of a conical surface. The third portion 453 has a third side surface 453e with a different inclination from that of the second side surface 452e, and a front surface 450d. The first side surface 451e, the second side surface 452e, and the third side surface 453e constitute a side surface 450e of the cathode cap 450. Also, the front surface 450d and the side surface 450e constitute the thermal electron emitting surface 450a of the cathode cap 450.

In the present modification, a part of the cathode cap 450 is constituted of the first portion 451 having a cylindrical shape of which a width w in the radial direction is uniform in the axial direction. Since the first side surface 451e that is a cylindrical surface is constituted of a curved surface parallel to the applying direction of the magnetic field B, the first side surface 451e may not effectively function as the thermal electron emitting surface, as illustrated in FIG. 4. On the other hand, the second side surface 452e or the third side surface 453e, which is a conical surface, effectively functions as the thermal electron emitting surface like the aforementioned embodiment. Therefore, when an area of the first side surface 451e which is occupied in the thermal electron emitting surface 450a is relatively small, in other words, an area of the second side surface 452e or the third side surface 453e is relatively large, it can be said that the similar effect as the aforementioned embodiment is obtained. In order to obtain the effect, it is required that a length $l_1$ of the first portion 451 is equal to or shorter than ½, preferably, equal to or shorter than ⅓ of a length l of the cathode cap 450. Also, the first portion 451 configured to have a cylindrical shape is desirably provided at a position close to the filament 28, that is, a position spaced apart from the internal space of the arc chamber 12. According to the present modification, even in the case of configuring the cathode cap 450 to partially have a cylindrical shape, it is possible to improve the generation efficiency of plasma and the durability of the cathode cap 450.

(Modification 4)

Figure 9:
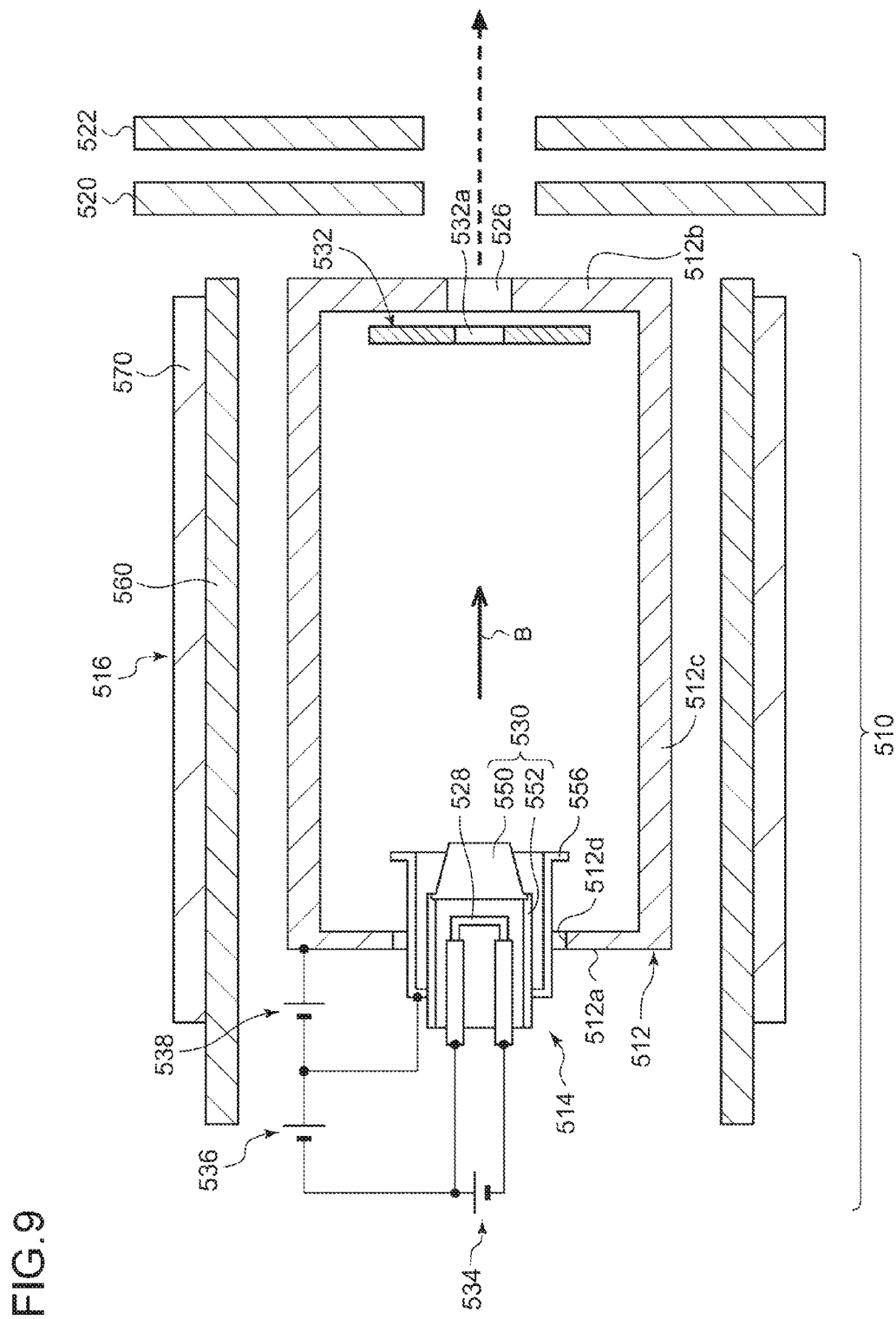
FIG. 9 is diagram illustrating a detailed configuration of a plasma generator according to a modification.

FIG. 9 is diagram illustrating a detailed configuration of a plasma generator 510 according to a modification. The present modification differs from the aforementioned embodiment in that a extracting opening 526 is provided in the lower surface plate 512b facing a thermal electron emitter 514, not being provided in a side wall plate 512c of the arc chamber 512. Next, the present modification will be described while focusing on the difference from the aforementioned embodiment.

The plasma generator 510 includes an arc chamber 512, a thermal electron emitter 514, a magnetic field generator 516, a repeller plate 532, and a filament power supply 534, a cathode power supply 536, and an arc power supply 538, which are a variety of power supplies. A suppression electrode 520 that is an extracting electrode and a ground electrode 522 are arranged in the vicinity of the plasma generator 510.

The arc chamber 512 includes a side wall plate 512*c* extending in the axial direction, and an upper surface plate 512*a* and a lower surface plate 512*b* provided at both ends of the side wall plate 512*c*. The thermal electron emitter 514 is provided through an attachment hole 512*d* of the upper surface plate 512*a*. An extracting opening 526 for extracting ions from plasma generated in the inside of the arc chamber 12 is provided in the lower surface plate 512*b*.

The thermal electron emitter 514 includes a filament 528, a cathode 530, and a thermal reflector 556. The cathode 530 includes a cathode cap 550 and a thermal break 552. The cathode cap 550 has a truncated conical shape similarly to the cathode cap 50 according to the aforementioned embodiment, and has a thermal electron emitting surface constituted of a plane surface and a curved surface in a direction intersecting with the axial direction. Also, the cathode cap 550 may have other shapes than the truncated conical shape as in the aforementioned modification.

The magnetic field generator 516 is provided around the arc chamber 512 outward in the radial direction and generates a magnetic field B in the axial direction in the inside of the arc chamber 512. The magnetic field generator 516 includes a solenoid coil 570. Between the arc chamber 512 and the solenoid coil 570, a heat shield 560 for protecting the solenoid coil 570 from radiant heat of the arc chamber 512 is provided.

The repeller plate 532 is provided at a position facing the thermal electron emitter 514 in the inside of the arc chamber 512. The repeller plate 532 is provided to be spaced apart from the lower surface plate 512*b* in the vicinity of the lower surface plate 512*b* for example. The repeller plate 532 has, for example, a disc shape and is provided with an opening 532*a* communicating with the extracting opening 526 in a central part thereof.

In the plasma generator 510 having the aforementioned configuration, the cathode cap 550 is heated by thermal electrons emitted by the filament 528, and emits thermal electrons. The thermal electrons emitted from the cathode cap 550 are accelerated by an arc voltage applied between the cathode 530 and the arc chamber 512, and are then introduced into the arc chamber 512 as beam electrons. The introduced beam electrons reciprocate between the cathode 530 and the repeller plate 532, and simultaneously move while drawing a spiral orbit along the magnetic field B in the axial direction. The reciprocating beam electrons then collide with and ionize source gas molecules in the inside of the arc chamber 512 to generate plasma. Some of ions in the generated plasma reach the extracting opening 526 by diffusion, and are extracted from the arc chamber 512 through the suppression electrode 520 that is an extracting electrode and the ground electrode 522.

Also in the present modification, since the thermal electron emitting surface of the cathode cap 550 is constituted of a plane surface and a curved surface which intersect with the axial direction in which the magnetic field B is applied, it is possible to enhance the emission efficiency of the thermal electrons and simultaneously, improve the durability of the cathode cap 550, similarly to the aforementioned embodiment. Therefore, a plasma generator which extracts ions in the axial direction as described in the present modification can obtain the same effect as the aforementioned embodiment by adopting the shape of the cathode cap 250, 350, 450, or 550 described above.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

In the aforementioned embodiment and modifications, there have been described the cases of configuring the cathode cap to have a rotationally symmetric shape. In another modification, it may be possible to use a cathode cap having a non-rotationally symmetric shape. For example, it may be possible to use a plurality of plane surfaces obliquely intersecting with the axial direction as a side surface of the cathode cap, instead of a conical surface. Specifically, it may be possible to use a polygonal conical surface or the like, as the side surface of the cathode cap.

In the aforementioned embodiment and the modifications, there have been described the cases of constituting the side surface of the cathode cap with a conical surface or a spherical surface. In another modification, any curved surface having a certain curvature or shape may be used as the thermal electron emitting surface, as long as a width in the radial direction becomes smaller toward the inside of the arc chamber. For example, the thermal electron emitting surface may be a convex curved surface, a concave curved surface, or a combination thereof.

In the aforementioned embodiment and modifications, there have been described the cases in which the arc chamber 12 is formed to have a substantially rectangular parallelepiped shape. In another modification, the arc chamber may have a substantially spherical shape, or may have a cylindrical shape or a polygonal cylindrical shape. In the case where the arc chamber is a cylindrical shape, the side surface of the arc chamber may be provided to extend in the axial direction and be provided with the thermal electron emitter and a repeller at respective open ends opposite to each other in the axial direction.

In the aforementioned embodiment and modifications, there have been described the cases in which at least a part of the cathode 30 is arranged in the inside of the arc chamber 12. In another modification, the cathode may be provided outside of the arc chamber, not in the inside of the arc chamber. For example, when the arc chamber has a cylindrical shape, the cathode may be arranged outside of the arc chamber at a position spaced apart from the open end of the arc chamber. Even in this case, the cathode cap is provided to protrude toward the inside of the arc chamber and is configured to supply thermal electrons to the inside of the arc chamber.

It should be understood that the invention is not limited to the above-described embodiment, but may be modified into various forms on the basis of the spirit of the invention. Additionally, the modifications are included in the scope of the invention.

What is claimed is:
1. A plasma generator, comprising:
an arc chamber having a plasma generation region in which plasma is generated in the inside thereof;
a magnetic field generator that applies a magnetic field to the plasma generation region; and
a cathode extending in an axial direction along an applying direction of the magnetic field applied to the plasma generation region and provided with a cathode cap that emits thermal electrons at a front end thereof, wherein the cathode cap protrudes toward the inside of the arc chamber in the axial direction and has a shape of which a width in the radial direction perpendicular to the axial direction becomes smaller toward the inside of the arc chamber.

2. The plasma generator according to claim 1, wherein the cathode cap has a thermal electron emitting surface exposed to an internal space of the arc chamber, and the thermal electron emitting surface includes at least one of a curved surface and a plane surface which obliquely intersect with the axial direction.

3. The plasma generator according to claim 2, wherein the thermal electron emitting surface includes a spherical surface or a spheroidal surface.

4. The plasma generator according to claim 2, wherein the thermal electron emitting surface includes a conical surface.

5. The plasma generator according to claim 2, wherein the thermal electron emitting surface has a cylindrical surface extending in the axial direction and is configured such that a length of the cylindrical surface is equal to or shorter than ½ of a length of the cathode cap in the axial direction.

6. The plasma generator according to claim 1, wherein the cathode cap has a rotationally symmetric shape with respect to a central axis extending in the axial direction.

7. The plasma generator according to claim 6, wherein the cathode cap has a shape in which a convex curved surface is added to an upper surface of a truncated cone.

8. The plasma generator according to claim 1, wherein the length of the cathode cap in the axial direction is equal to or longer than ½ of the width in the radial direction.

9. The plasma generator according to claim 1, further comprising a thermal reflector with a cylindrical shape provided around the cathode cap outward in the radial direction and extending in the axial direction.

10. The plasma generator according to claim 9, wherein the thermal reflector extends toward the inside of the arc chamber in the axial direction beyond a position where at least a half-length of the cathode cap in the axial direction is surrounded with the thermal reflector.

11. The plasma generator according to claim 10, wherein a protruding length in the axial direction from an front end of the thermal reflector to the front end of the cathode cap is equal to or greater than 10% of the length of the cathode cap in the axial direction.

12. The plasma generator according to claim 1, further comprising a filament provided inside of the cathode to heat the cathode cap by thermal electrons, wherein the cathode cap has a heat inflow surface facing the filament, and the heat inflow surface is constituted of a plane surface perpendicular to the axial direction.

13. The plasma generator according to claim 1, wherein a part of a wall constituting the arc chamber is provided with an attachment hole passing through the wall in the axial direction, and the cathode is inserted through the attachment hole.

14. The plasma generator according to claim 1, further comprising a repeller provided at a position facing the cathode in the axial direction such that the plasma generation region is interposed therebetween.

15. A thermal electron emitter which emits thermal electrons into an arc chamber including a plasma generation region, to which a magnetic field is applied, in the inside thereof, the thermal electron emitter comprising:
    a thermal break extending in an axial direction along an applying direction of the magnetic field applied to the plasma generation region;
    a cathode cap attached to a front end of the thermal break to emit thermal electrons into the arc chamber; and
    a filament provided inside of the thermal break to heat the cathode cap by thermal electrons, wherein
    the cathode cap protrudes toward the inside of the arc chamber in the axial direction and has a shape of which a width in the radial direction perpendicular to the axial direction becomes smaller toward the inside of the arc chamber.

* * * * *